US012665014B2

(12) United States Patent
Wang et al.

(10) Patent No.: US 12,665,014 B2
(45) Date of Patent: Jun. 23, 2026

(54) METHODS FOR CONTROLLING BIT LINE VOLTAGES IN MEMORY DEVICES

(71) Applicant: Yangtze Memory Technologies Co., Ltd., Wuhan (CN)

(72) Inventors: Bowen Wang, Wuhan (CN); Liang Qiao, Wuhan (CN); Weijun Wan, Wuhan (CN); Jinchi Han, Wuhan (CN); Zhichao Du, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 271 days.

(21) Appl. No.: 18/328,186

(22) Filed: Jun. 2, 2023

(65) Prior Publication Data

US 2024/0386938 A1      Nov. 21, 2024

(30) Foreign Application Priority Data

May 18, 2023      (CN) .......................... 202310576566.8

(51) Int. Cl.
*G11C 11/40*        (2006.01)
*G11C 11/4074*      (2006.01)
*G11C 11/4094*      (2006.01)

(52) U.S. Cl.
CPC ...... *G11C 11/4074* (2013.01); *G11C 11/4094* (2013.01)

(58) Field of Classification Search
CPC . G11C 11/4074; G11C 11/4094; G11C 16/24; G11C 16/0483
See application file for complete search history.

(56)      References Cited

U.S. PATENT DOCUMENTS

| | | | | |
|---|---|---|---|---|
| 11,139,018 | B1 * | 10/2021 | Zainuddin | ................ G11C 7/12 |
| 2020/0402576 | A1 * | 12/2020 | Park | ..................... G11C 13/003 |
| 2021/0065770 | A1 * | 3/2021 | Watanabe | ........... G11C 11/4076 |

OTHER PUBLICATIONS

Yangtze Memory Technologies Co., Ltd., "First Examination Opinion Notice," Date of Pub.: Sep. 13, 2025, CN Patent App. No. 202310576566.8, 4 p. (plus 4 page translation).

* cited by examiner

*Primary Examiner* — Mohammed A Bashar
(74) *Attorney, Agent, or Firm* — Conley Rose, P.C.

(57)      ABSTRACT
The present disclosure provides a method for controlling bit line voltages in a three-dimensional memory device. The method includes ramping up a bit line clamp regulation voltage and a control signal regulation voltage. The method also includes ramping up a bit line clamp enabling voltage and a control signal enabling voltage. The method also includes increasing a bit line clamp voltage in one stage, and increasing a control signal voltage in two stages. The method also includes decreasing the control signal voltage. The method also includes ramping down the bit line clamp enabling voltage, the bit line clamp regulation voltage, the control signal enabling voltage, and the control signal regulation voltage. The method further includes decreasing the bit line clamp voltage.

20 Claims, 12 Drawing Sheets

100

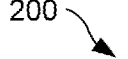
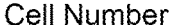
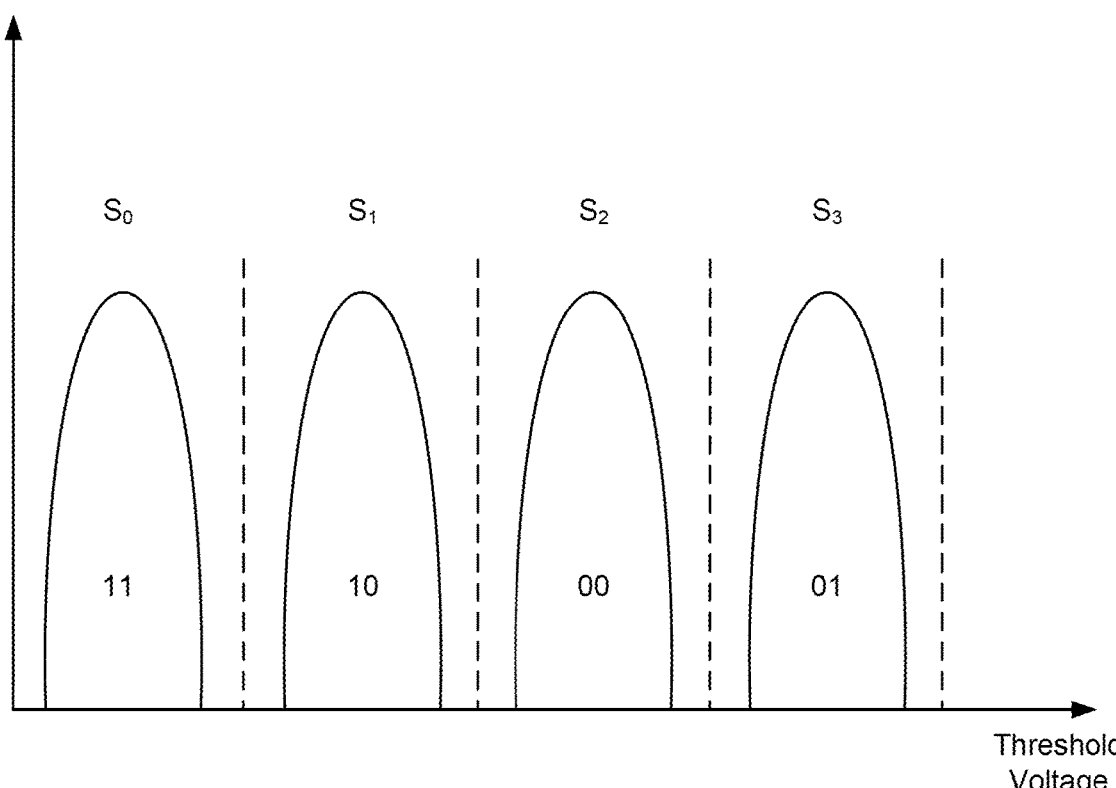
FIG. 2

400

104

Peripheral circuit 410

Programming voltage generator 412

Enabling signal generator 414

Voltage Regulator 416

NAND flash memory chips 430

Controller 420

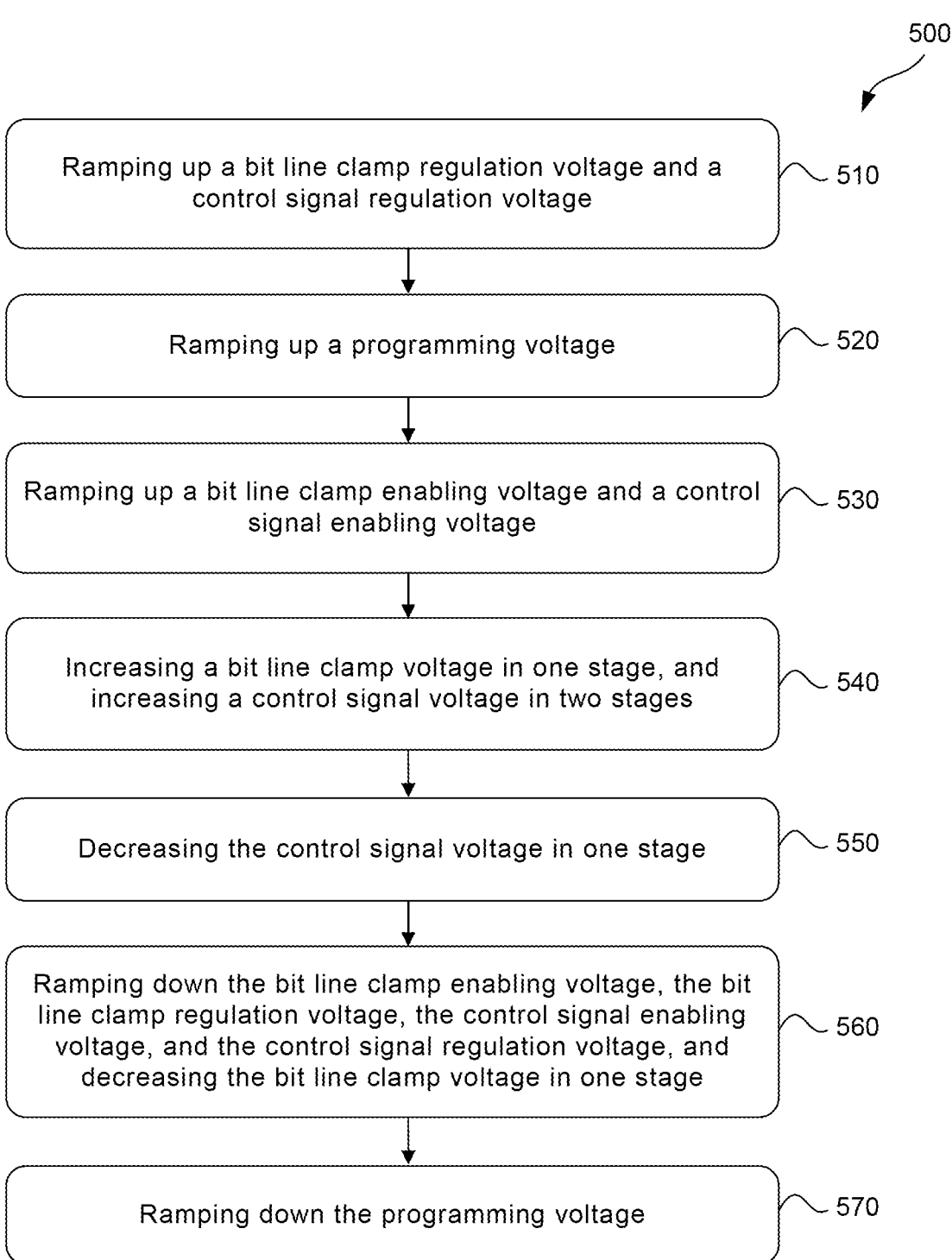

500

Ramping up a bit line clamp regulation voltage and a control signal regulation voltage — 510

Ramping up a programming voltage — 520

Ramping up a bit line clamp enabling voltage and a control signal enabling voltage — 530

Increasing a bit line clamp voltage in one stage, and increasing a control signal voltage in two stages — 540

Decreasing the control signal voltage in one stage — 550

Ramping down the bit line clamp enabling voltage, the bit line clamp regulation voltage, the control signal enabling voltage, and the control signal regulation voltage, and decreasing the bit line clamp voltage in one stage — 560

Ramping down the programming voltage — 570

METHODS FOR CONTROLLING BIT LINE VOLTAGES IN MEMORY DEVICES

CROSS-REFERENCE TO RELATED APPLICATIONS AND INCORPORATED BY REFERENCE

This application claims priority to Chinese Patent Application No. 202310576566.8 filed on May 18, 2023, which is incorporated herein by reference in its entirety.

TECHNICAL FIELD

The present disclosure generally relates to methods for controlling bit line voltages in memory devices.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices.

The present disclosure relates to memory devices and operation methods thereof. A flash memory device is a low-cost, high-density, non-volatile solid-state storage medium that can be electrically erased and reprogrammed. Flash memory devices can include NOR flash memory devices and NAND flash memory devices. Various operations can be performed by a flash memory device, such as read, program (write), and erase, to change the threshold voltage of each memory cell to a nominal level. For a NAND flash memory device, an erase operation can be performed at the block level, and a program operation or a read operation can be performed at the page level.

BRIEF SUMMARY

Embodiments of methods for simulating power circuits and systems for performing the same are described in the present disclosure.

Some aspects of this disclosure relate to a method for controlling bit line voltages in a three-dimensional memory device. The method can include ramping up a bit line clamp regulation voltage and a control signal regulation voltage. The method can also include ramping up a bit line clamp enabling voltage and a control signal enabling voltage. The method can also include increasing a bit line clamp voltage in one stage, and increasing a control signal voltage in two stages. The method can also include decreasing the control signal voltage. The method can also include ramping down the bit line clamp enabling voltage, the bit line clamp regulation voltage, the control signal enabling voltage, and the control signal regulation voltage. The method can also include decreasing the bit line clamp voltage.

According to some aspects, the bit line clamp regulation voltage and the control signal regulation voltage can be ramped up at a same first time point. The bit line clamp enabling voltage and the control signal enabling voltage can be ramped up at a same second time point after the first time point.

According to some aspects, the ramping up the bit line clamp regulation voltage and the control signal regulation voltage can include increasing the bit line clamp voltage and the control signal voltage from a low level at the second time point, and starting to increase the control signal voltage from an intermediate level at a third time point, such that the bit line clamp voltage and the control signal voltage reach their high levels respectively at a fourth time point.

According to some aspects, the decreasing the control signal voltage can include decreasing the control signal voltage to the low level before ramping down the bit line clamp enabling voltage, the bit line clamp regulation voltage, the control signal enabling voltage, and the control signal regulation voltage.

According to some aspects, the ramping down the bit line clamp enabling voltage, the bit line clamp regulation voltage, the control signal enabling voltage, and the control signal regulation voltage may be performed simultaneously. The ramping down the bit line clamp enabling voltage and starting to decrease the bit line clamp voltage may be performed at a same fifth time.

Some aspects of this disclosure relate to a method for controlling bit line voltages in a three-dimensional memory device. The method can include generating a first voltage difference between a first bit line terminal and a second bit line terminal. The method can also include ramping up the first bit line terminal and the second bit line terminal by a second voltage difference. The second voltage difference can be different from the first voltage difference. The method can also include ramping up the first bit line terminal and the second bit line terminal by a third voltage difference. The third voltage difference can be different from the first and second voltage differences. The method can also include repeating the ramping up the first bit line terminal and the second bit line terminal by the third voltage difference a plurality of times.

According to some aspects, the generating the first voltage difference between the first bit line terminal and the second bit line terminal can include increasing a first voltage to the first bit line terminal, and maintaining the second bit line terminal at a ground voltage level to form the first voltage difference between the first and second bit line terminals.

According to some aspects, the ramping up the first bit line terminal and the second bit line terminal by the second voltage difference can include increasing the first and second bit line terminals with a pre-determined fixed value as the second voltage difference, such that the first and second bit line terminals substantially keep the first voltage difference.

According to some aspects, the ramping up the first bit line terminal and the second bit line terminal by the third voltage difference can include increasing the first and second bit line terminals with the third voltage difference, such that the first and second bit line terminals substantially keep the first voltage difference.

According to some aspects, the repeating the ramping up the first bit line terminal and the second bit line terminal by the third voltage difference a plurality of times can include repeating the ramping up the first bit line terminal and the second bit line terminal by the third voltage difference a plurality of times at least three times.

Some aspects of this disclosure relate to a three-dimensional memory device. The three-dimensional memory device can include a plurality of bit lines; a voltage generation circuit coupled to the plurality of bit lines and configured to provide voltages to the plurality of bit lines; and a controller configured to control the voltage generation circuit. The voltage generation circuit can be configured to ramp up a bit line clamp regulation voltage and a control signal regulation voltage. The voltage generation circuit can also be configured to ramp up a bit line clamp enabling voltage and a control signal enabling voltage. The voltage generation circuit can also be configured to increase a bit line clamp voltage in one stage. The voltage generation circuit can also be configured to increase a control signal voltage in two stages. The voltage generation circuit can also be configured to decrease the control signal voltage. The voltage generation circuit can also be configured to ramp down the bit line clamp enabling voltage, the bit line clamp regulation voltage, the control signal enabling voltage, and the control signal regulation voltage. The voltage generation circuit can further be configured to decrease the bit line clamp voltage.

According to some aspects, the controller can be further configured to control the voltage generation circuit to: ramp up the bit line clamp regulation voltage and the control signal regulation voltage at a same first time point; and ramp up the bit line clamp enabling voltage and the control signal enabling voltage at a same second time point after the first time point.

According to some aspects, the controller can be further configured to control the voltage generation circuit to: start to increase the bit line clamp voltage and the control signal voltage from a low level at the second time point, and start to increase the control signal voltage from an intermediate level at a third time point, such that the bit line clamp voltage and the control signal voltage reach their high levels respectively at a same fourth time point.

According to some aspects, the controller can be further configured to control the voltage generation circuit to: decrease the control signal voltage to the low level before ramping down the bit line clamp enabling voltage, the bit line clamp regulation voltage, the control signal enabling voltage, and the control signal regulation voltage.

According to some aspects, the controller can be further configured to control the voltage generation circuit to: ramp down the bit line clamp enabling voltage, the bit line clamp regulation voltage, the control signal enabling voltage, and the control signal regulation voltage, and start to decrease the bit line clamp voltage at a same fifth time.

Some aspects of this disclosure relate to a memory device. The memory device includes a plurality of bit lines; a voltage generation circuit configured to provide voltages to the plurality of bit lines; and a controller configured to control the voltage generation circuit. Further, the controller can be configured to: generate a first voltage difference between a first bit line terminal and a second bit line terminal, ramp up the first bit line terminal and the second bit line terminal by a second voltage difference, and ramp up the first bit line terminal and the second bit line terminal by a third voltage difference. The first, second and third voltage differences can be different from each other.

According to some aspects, the controller can be further configured to control the voltage generation circuit to: increase a first voltage to the first bit line terminal, and maintain the second bit line terminal at a ground voltage level to form the first voltage difference between the first and second bit line terminals.

According to some aspects, the controller can be further configured to control the voltage generation circuit to: increase the first bit line terminal and the second bit line terminal by a pre-determined fixed voltage as the second voltage difference, such that the first and second bit line terminals substantially keep the first voltage difference.

According to some aspects, the controller can be further configured to control the voltage generation circuit to: repeating at least four times of increasing the first bit line terminal and the second bit line terminal by the third voltage difference, such that the first and second bit line terminals substantially keep the first voltage difference.

According to some aspects, the first voltage difference can be in a range between about 0.25V and about 0.95V. The second voltage difference can be about 0.25V. The third voltage different can be a quarter of a difference between a target voltage of the second bit line terminal and 0.25V.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 2 illustrates schematic diagram of an example of threshold voltage ranges of 2-bit MLC memory cells, according to some embodiments of the present disclosure.

FIG. 5 illustrates a flow diagram of an exemplary method for performing a programming operation of a flash memory string, in accordance with some embodiments of the present disclosure.

Figure 1A:
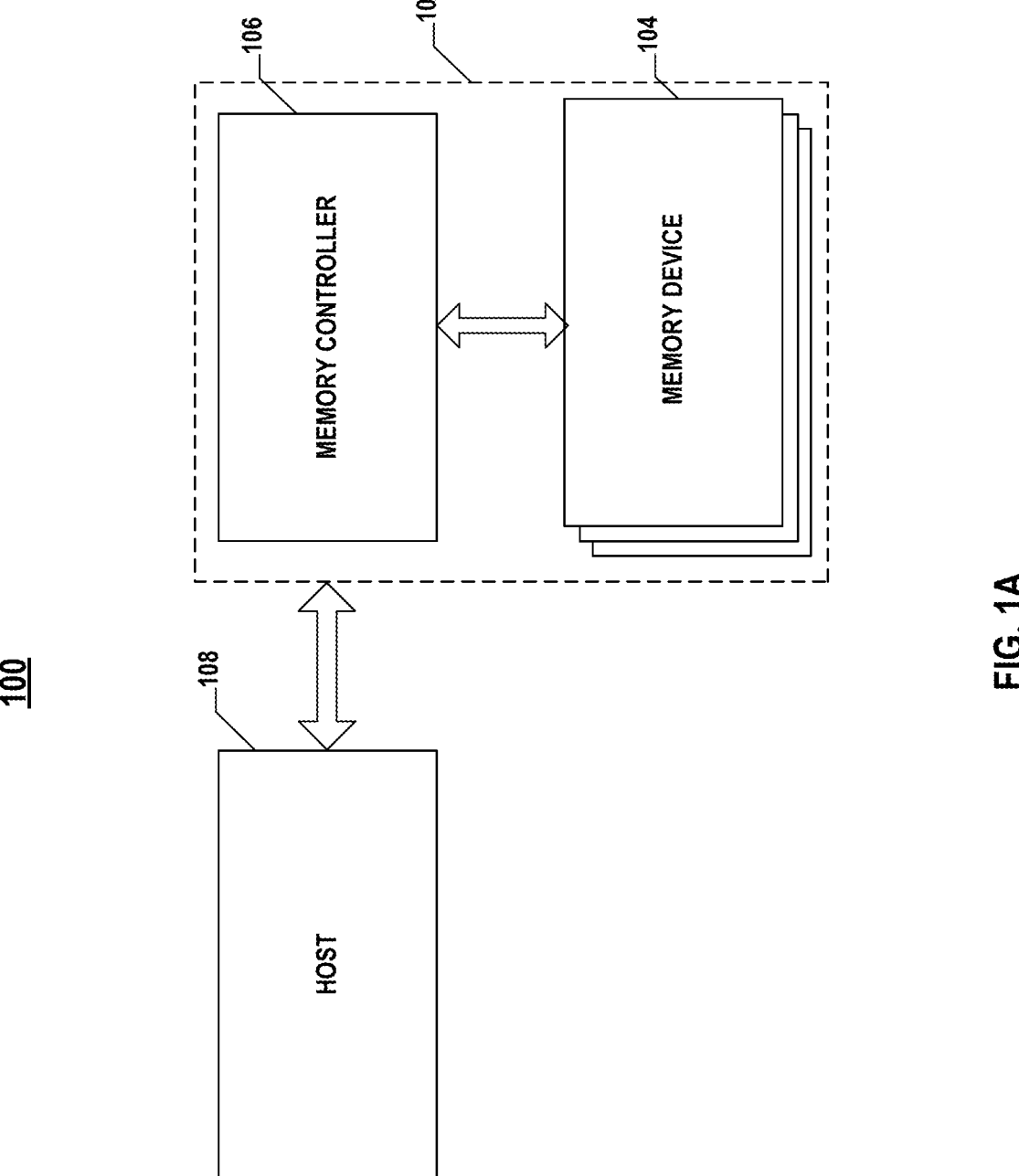
FIG. 1A illustrates a block diagram of an electronic system having a memory device, according to some aspects of the present disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

Non-volatile memory devices can retain their stored data for an extended period without the application of power. Flash memory devices have developed into a popular type of non-volatile memory for a wide range of applications. Flash memory devices are commonly used in electronic systems, such as personal computers, digital cameras, digital media players, digital recorders, vehicles, wireless devices, cellular phones, and removable memory modules, and the uses for flash memory continue to expand.

Non-volatile memory devices can include NAND flash memory devices with arrays of memory cells. Memory cells of a string are connected together in series, for example, from a drain terminal of a memory cell to a source terminal of an another memory cell. A NAND architecture array can include arrays of flash memory cells arranged in a matrix of rows and columns such that the gate terminal of each flash memory cell of the array are coupled by rows to word lines. Memory cells of the array are also arranged in the form of columns (e.g., memory strings), for example, 8, 16, 32, or more memory cells can be arranged in a memory string. The memory cells in the same memory string are coupled together in series, from a source terminal to a drain terminal, between a common source line and a column bit line.

Flash memory cells are programmed by programming cycles. Memory cells of a selected block can be erased and followed by programming selected memory cells. For a NAND array, a block of memory cells is erased by setting all the word lines to ground voltage and applying an erase voltage to the substrate where the block of cells are formed. This removes the charges trapped in the floating gates or other charge trap structures of the transistors, making the resulting threshold voltage of the memory cells fall in the range of S0, which can represent an erased state. During programming operations of memory cells, bit lines can be activated or deactivated for programming by applying suitable voltage bias. In some embodiments, bit lines can be voltage-biased to different voltages during a programming operation. The different voltage control flow can lead to undesirable coupling that may errors in memory cell programming.

Various embodiments described in the present disclosure are directed to controlling bit line voltage biases during a programming operation on non-volatile memory devices, such as three-dimensional NAND memory devices. In some embodiments, a multi-stage voltage ramping sequence can be applied to bit line terminals to provide improved bit line voltage uniformity. Each "stage" is a distinct portion within the process. For example, the multi-stage voltage ramping sequence can be a two-stage ramping sequence that includes first-stage and second-stage ramp-up procedures. In some embodiments, the first-stage ramp-up procedure can include applying a first voltage to a first bit line terminal while maintaining a second bit line terminal at a ground voltage level, therefore establishing a voltage difference between the first and second bit line terminals. A second-stage ramp-up procedure can include multiple sub-stages ramp-up procedures that increase voltage levels of the first and second bit line terminals to their respective nominal voltage levels. During the second-stage ramp-up procedure, a substantially constant voltage differential between the first and second bit line terminals can be maintained throughout the ramp-up process to reduce undesirable coupling. During the programming sequence, the established voltage levels of the first and second bit line terminals can be left floating, according to some embodiments. Benefits of using the multi-stage voltage ramping sequence and floating the bit line terminals can include, but are not limited to, improved bit line voltage set up and state differentiation, reduced side effects of bit line terminal coupling, unified firmware control, and no additional hardware costs.

FIG. 1A illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1A, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive the data to or from memory devices 104.

Memory device 104 can be any memory devices disclosed herein, such as a NAND Flash memory device. Consistent with the scope of the present disclosure, memory controller 106 may control a programming operation on non-volatile memory devices, such as three-dimensional NAND memory devices. The peripheral circuits, such as the word line drivers, may apply a multi-stage voltage ramping sequence to bit line terminals. For example, the multi-stage voltage ramping sequence can be a two-stage ramping sequence that includes first-stage and second-stage ramp-up procedures. In some embodiments, the first-stage ramp-up procedure can include applying a first voltage to a first bit line terminal while maintaining a second bit line terminal at a ground voltage level, therefore establishing a voltage difference between the first and second bit line terminals. A second-stage ramp-up procedure can include multiple sub-stages ramp-up procedures that increase voltage levels of the first and second bit line terminals to their respective nominal voltage levels.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, programming memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component inter-connection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 1C:
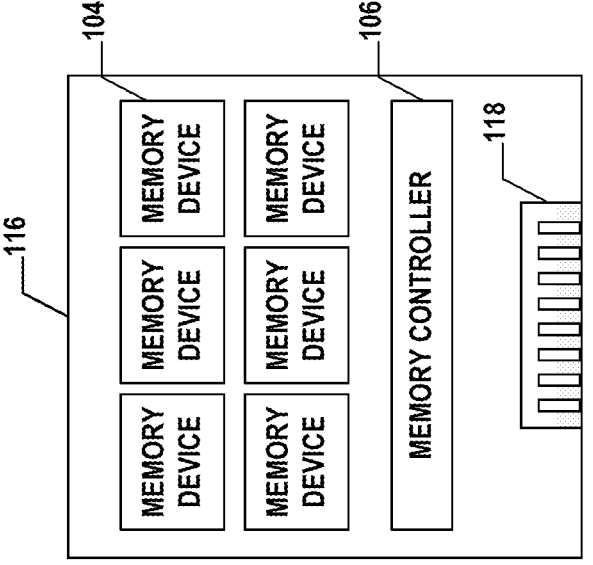
FIG. 1C illustrates a diagram of a solid-state drive (SSD) having a memory device, according to some aspects of the present disclosure.
Figure 1B:
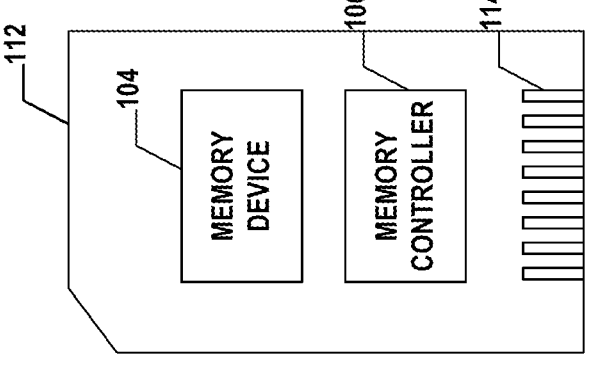
FIG. 1B illustrates a diagram of a memory card having a memory device, according to some aspects of the present disclosure.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 1B, memory controller 106 and a single memory device 104 may be integrated into a memory card 112. Memory card 112 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc.

Memory card 112 can further include a memory card connector 114 coupling memory card 112 with a host (e.g., host 108 in FIG. 1A). In another example as shown in FIG. 1C, memory controller 106 and multiple memory devices 104 may be integrated into an SSD 116. SSD 116 can further include an SSD connector 118 coupling SSD 116 with a host (e.g., host 108 in FIG. 1A). In some implementations, the storage capacity and/or the operation speed of SSD 116 is greater than those of memory card 112.

Figure 1D:
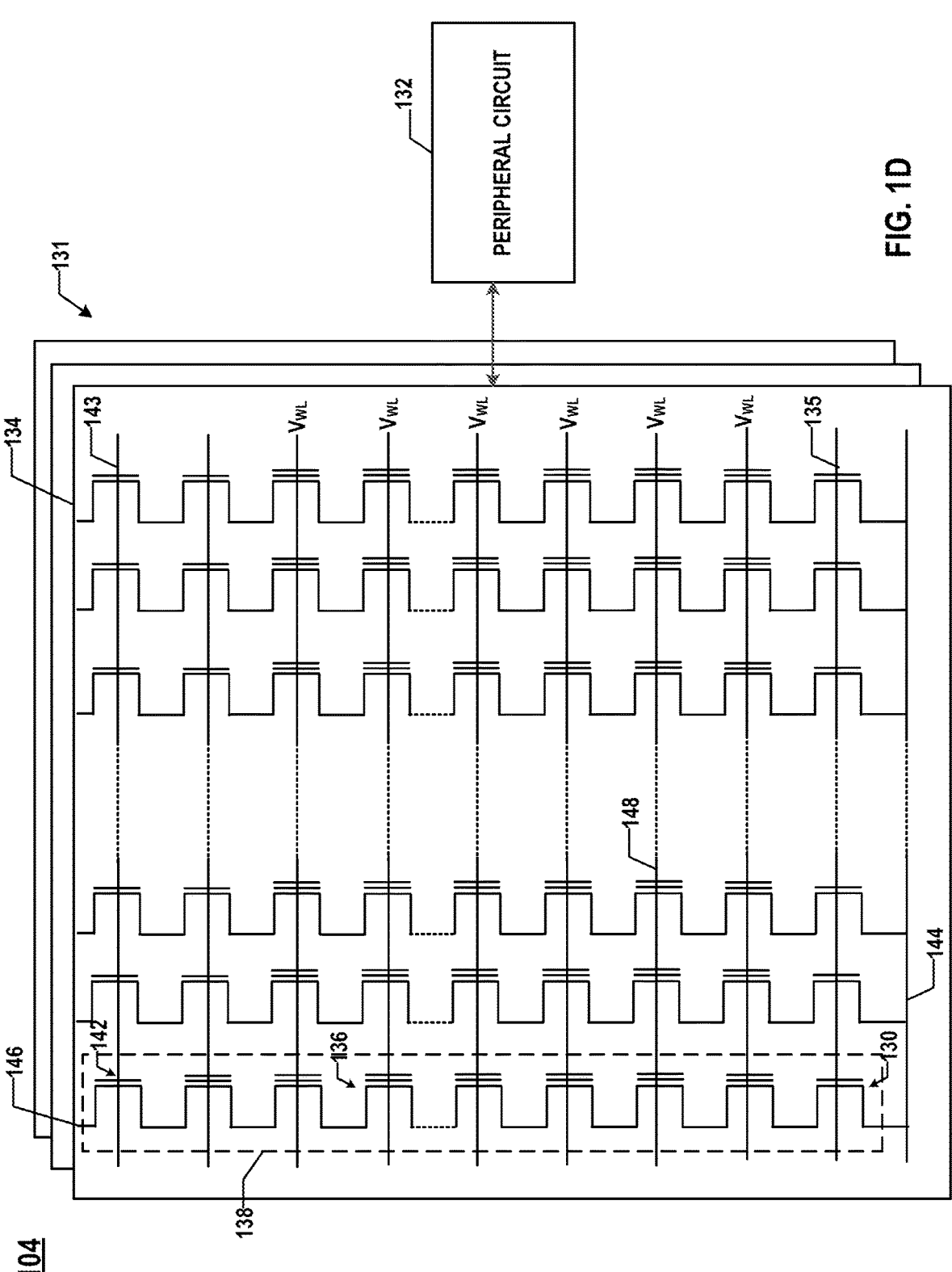
FIG. 1D illustrates a schematic diagram of a memory device including peripheral circuits, according to some aspects of the present disclosure.

FIG. 1D illustrates a schematic circuit diagram of an exemplary memory device 104 including peripheral circuits 132, according to some aspects of the present disclosure. Memory device 104 can be an example of memory device 104 in FIG. 1A-C. Memory device 104 can include a memory cell array 131 and peripheral circuits 132 coupled to memory cell array 131. Memory cell array 131 can be a NAND Flash memory cell array in which memory cells 136 are provided in an array of NAND memory strings 138. In some implementations, each NAND memory string 138 includes a plurality of memory cells 136 coupled in series and stacked vertically. Each memory cell 136 can hold a continuous, analog value, such as an electrical voltage or charge, which depends on the number of electrons trapped within a region of memory cell 136. Each memory cell 136 can be either a floating gate type of memory cell including a floating-gate transistor or a charge trap type of memory cell including a charge-trap transistor.

In some implementations, each memory cell 136 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 136 is capable of storing more than a single bit of data in more than two memory states. For example, the MLC can store two bits per cell (also known as multi-level cell (MLC)), three bits per cell (also known as triple-level cell (TLC)), or four bits per cell (also known as a quad-level cell (QLC)).

As shown in FIG. 1D, each NAND memory string 138 can also include an SSG transistor 130 at its source end and a DSG transistor 142 at its drain end. SSG transistor 130 and DSG transistor 142 can be configured to activate select NAND memory strings 138 during read and program operations. In some implementations, the sources of NAND memory strings 138 in the same block 134 are coupled through a same source line (SL) 144. The drain of each NAND memory string 138 is coupled to a respective bit line 146, according to some implementations. In some implementations, each NAND memory string 138 is configured to be selected or unselected by applying a DSG select voltage or a DSG unselect voltage to the gate of respective DSG transistor 142 through one or more DSG lines 143 and/or by applying an SSG select voltage or an SSG unselect voltage to the gate of respective SSG transistor 130 through one or more SSG lines 135. NAND memory string 138 can thus become a select NAND memory string or an unselect NAND memory string.

As shown in FIG. 1D, NAND memory strings 138 can be organized into multiple blocks 134. In some implementations, each block 134 is the basic data unit for erase operations, i.e., all memory cells 136 on the same block 134 are erased at the same time. It should be understood that, in some implementations, the erase operation may be performed at the half-block level, at the quarter-block level, or at the level of any suitable number of blocks or any suitable number of fractions in a block. Memory cells 136 of adjacent NAND memory strings 138 can be coupled through word lines 148 that select which row of memory cells 136 is affected by read and program operations.

As shown in FIG. 1D, memory cell array 131 can include an array of memory cells 136 in a plurality of rows and a plurality of columns in each block 134. One row of memory cells 306 corresponds to one or more pages, and one column of memory cells corresponds to one NAND memory string 138, according to some implementations. The plurality of rows of memory cells 136 can be respectively coupled to word lines 148, and the plurality of columns of memory cells 136 can be respectively coupled to bit lines 146.

Figure 1E:
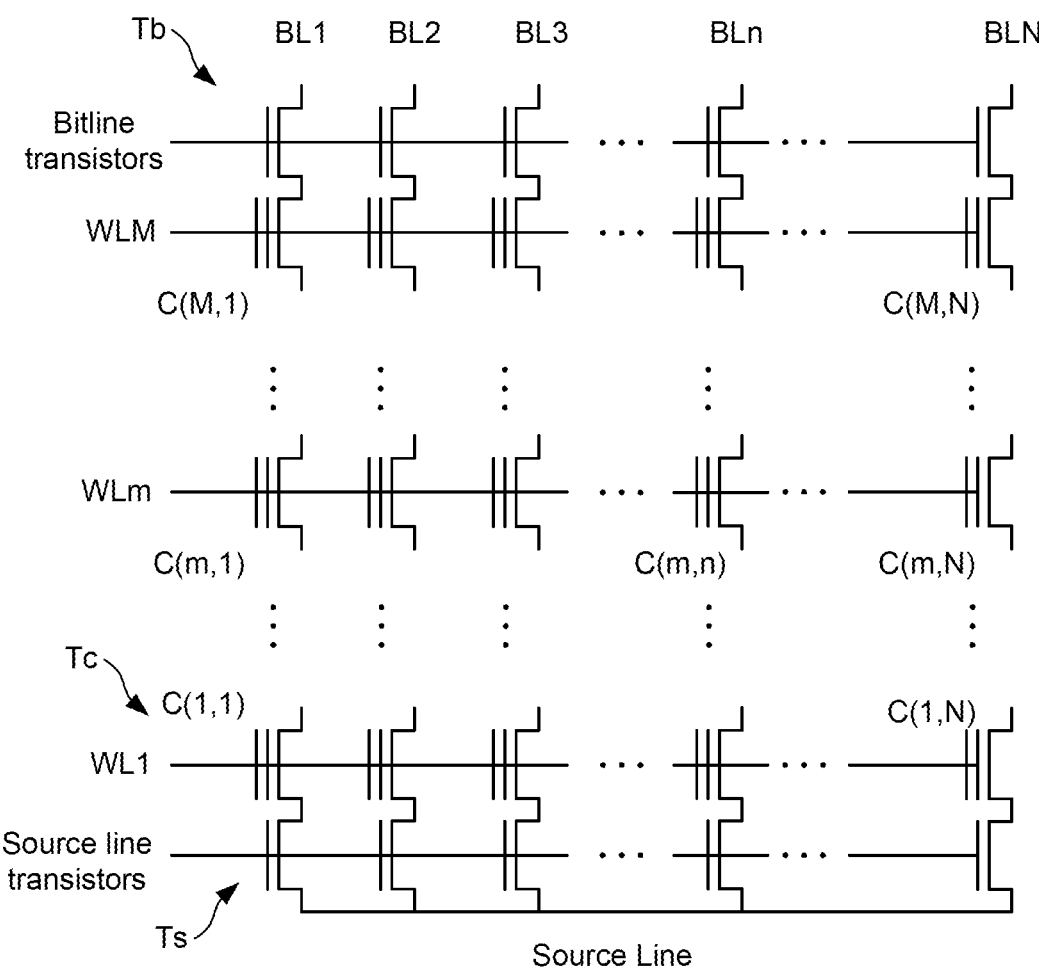
FIG. 1E illustrates a schematic diagram of memory arrays of a non-volatile memory device, according to some embodiments of the present disclosure.

FIG. 1E illustrates a schematic diagram of memory arrays of a non-volatile memory device, according to some embodiments. Non-volatile memory array 150 can be an example of memory arrays 131 in FIG. 1D. Non-volatile memory array 150 includes memory cells C(1,1) to C(M,N) arranged in an array format, where M and N represent positive integers. Specifically, non-volatile memory array 150 includes M number of rows (WL1-WLM) and N number of columns (BL1-BLN). In some embodiments, non-volatile memory array 150 can include additional rows and columns of memory cells, and are not included in FIG. 1E for simplicity. In some embodiments, non-volatile memory array 150 can be a part of a three-dimensional NAND memory device. As shown in FIG. 1E, N number of memory cells can be coupled to a same word line and M number of memory cells can be coupled to a same bit line. For example, memory cells C(1,1) to C(1,N) can be coupled to a word line WL1, and memory cells C(M,1) to C(M,N) can be coupled to a word line WLM. Memory cells C(1,1) to C(M,1) can be coupled to a bit line BL1, while memory cells C(M,1) to C(M,N) can be coupled to a bit line BLN. A terminal of a memory column can be coupled to a bit line via a bit line transistor Tb and the other terminal can be coupled to a source line via a source line transistor Ts. Non-volatile memory array 150 can also include a control circuit (not shown in FIG. 1E) for implementing a programming method to the memory cell array.

Each memory cell of the memory cells C(1,1) to C(M,N) can include a transistor Tc. In some embodiments, the transistor Tc can be a floating gate transistor. In some embodiments, the transistor Tc can be a charge trapping transistor. During a programming loop of a program operation for the memory cells C(1,1) to C(M,N), the gate terminals of the transistors Tc of the memory cells C(1,1) to C(M,N) can receive one or more programming pulses from the word lines WL1 to WLM, and bit line terminals of the transistors Tc can receive one or more bit line bias voltages from bit lines BL1 to BLN. The voltage of the programming pulse can increase by a step size during the next programming loop. This method can be referred to as incremental step pulse programming (ISPP). ISPP allows electrons to be injected to the gate structures of the transistors Tc, thus increasing the threshold voltages of the transistors Tc by step size voltages. The transistors Tc would increase to pass a verify level of a target data state. Consequently, a target data state in the memory cells C(1,1) to C(M,N) can be identified according to threshold voltages of memory cells C(1,1) to C(M,N).

During programming operations of non-volatile memory devices, there is a tradeoff between reducing programming time and achieving tight threshold voltage distributions for the different data states for the memory cells C(1,1) to C(M,N). Programming speed can be increased by using a larger program pulse step size. However, this results in large overshoots past the verify level, causing a wide threshold voltage distribution. On the other hand, if a smaller program pulse step size is used, a tighter threshold voltage distribution is achieved at the cost of increased programming time. Another approach is to verify the memory cells C(1,1) to C(M,N) at two separate verify levels for each target data state. Using the cell C(1,1) as an example, before the threshold voltage of the cell C(1,1) reaches a low verify level of its target data state, its bit line bias voltage is set to a low level such as 0 V to inject more electrons to the cell C(1,1). When the threshold voltage of the cell C(1,1) is higher than the low verify level, its bit line bias voltage is set to an intermediate level to let the memory cell inject less electrons to the cell C(1,1). When the threshold voltage of the cell C(1,1) exceeds a high verify level of its target data state, its bit line bias voltage is set to a high level such as a system voltage to inhibit programming of the cell C(1,1). Therefore, programming flash memory cells can require various levels of voltage biases to be applied to bit lines based on the verification results. For example, various levels of bit line voltage bias can be used in programming schemes with three-level bit line bias or four-level bit line bias.

FIG. 2 is schematic diagram of an example of threshold voltage ranges of 2-bit MLC memory cells. A memory cell can be programmed to a threshold voltage that falls within one of four different ranges S0, S1, S2, and S3. Each range represents a data state corresponding to a pattern of two bits. A margin can be maintained between each range S0 to S3 to prevent overlapping. For example, if the voltage of a flash memory cell falls within the first threshold voltage range S0, the cell can be considered to be storing a "11" state, which can represent an erased state. If the voltage of the flash memory cell falls within the second threshold voltage range S1, the cell can be considered as storing a "10" state. If the voltage of a memory cell falls within the third threshold voltage range S2, the cell can be considered as storing a "00" state. If the voltage of a memory cell falls within the fourth threshold voltage range S3, the cell can be considered as storing a "01" state.

Flash memory cells are programmed by programming cycles. Memory cells of a certain block are first erased and then select cells are programmed. For a NAND flash memory array, a block of cells can be erased by setting the word lines to ground voltage and applying an erase voltage to the substrate where the block of cells are formed. This removes the charges trapped in the floating gates or other charge trap structures of the transistors, making the resulting threshold voltage of the memory cells fall in the range of S0, which can represent an erased state.

Flash programming involves applying one or more programming pulses to a word line, for example word line WLm in FIG. 1, where m is an integer between 1 and M. This is to control the gate of each memory cell C(m,1) to C(m,N). For example, programming pulses may start at about 15 V and increase for each subsequent programming pulse. In some embodiments, this programming method can be referred to as incremental step pulse programming (ISPP). While a programming pulse can be applied to the word line WLm, a voltage bias can also be applied to channels of these memory cells resulting in a charge transfer from the channel to the floating gates of the selected memory cells.

Figure 3:
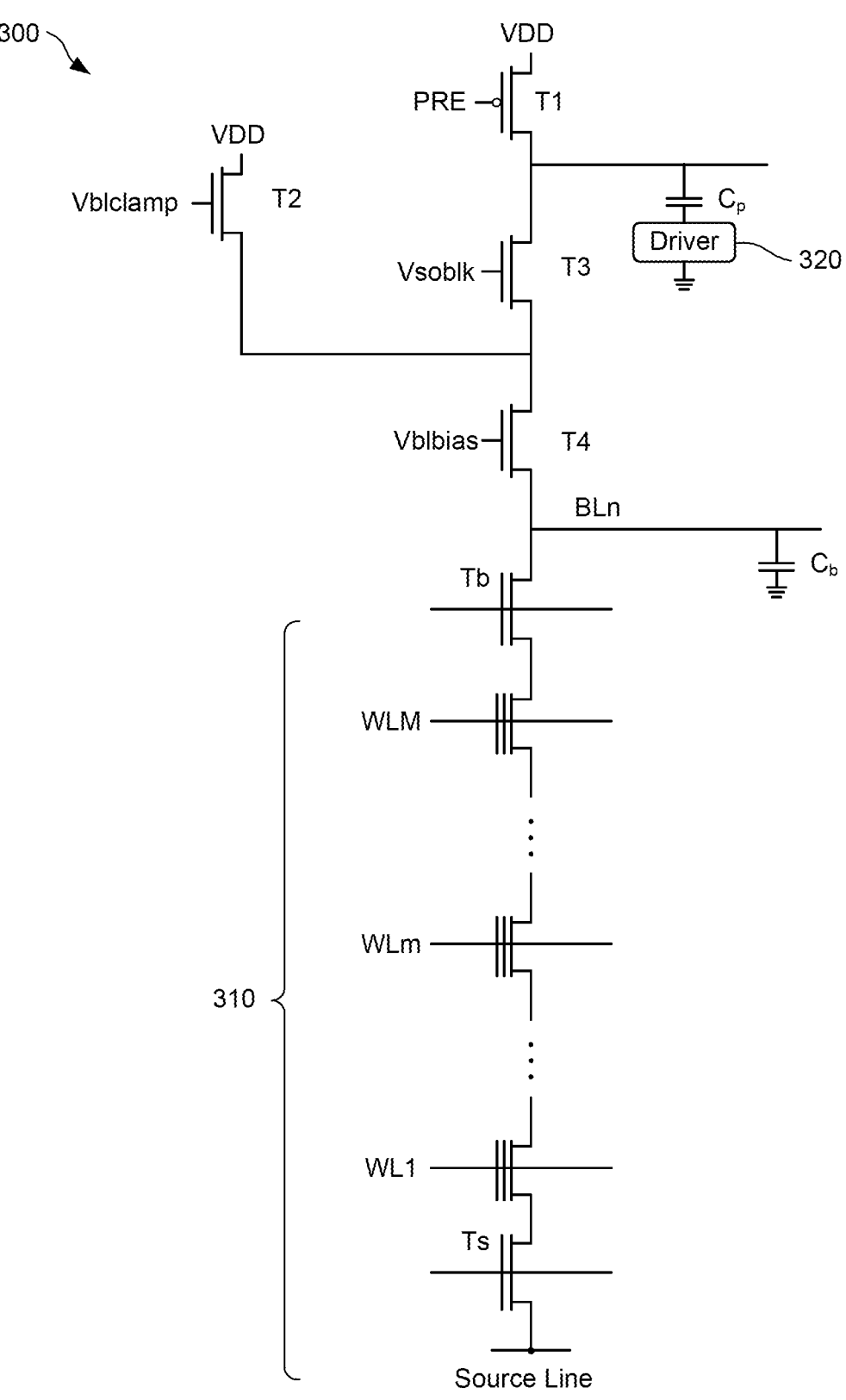
FIG. 3 illustrates a schematic circuit diagram of memory cells formed on a bit line, according to some embodiments of the present disclosure.

FIG. 3 is a schematic circuit diagram of memory cells formed on a bit line, according to some embodiments. The circuit 300 includes a first switch T1, a second switch T2, a third switch T3, and a fourth switch T4. The switches can be formed using any suitable semiconductor devices, such as metal-oxide-semiconductor field-effect transistors (MOS- FETs). For example, the switches can be formed using a p-type or an n-type MOSFET. Additional circuitry, such as boost drivers or sense circuits, can be included in circuit 300 and are not illustrated in FIG. 3 for simplicity.

A first end of first switch T1 can be coupled to a system VDD reference voltage and a second end of first switch T1 can be coupled to a first end of third switch T3. A first end of second switch T2 can be coupled to the system VDD reference voltage and a second end of second switch T2 can be coupled to a second end of the third switch T3. A first end of fourth switch T4 can be coupled to the second end of second switch T2 and the second end of third switch T3. A second end of fourth switch T4 can be coupled to a bit line BLn and a memory cell string 310. A driver circuit 320 can be coupled to the second end of first switch T1 and first end of third switch T3 through coupling capacitor $C_p$. Driver circuit 320 can be a boost driver circuit configured to provide a boost voltage. Capacitor $C_b$ coupled between bit line BLn and ground is the parasitic capacitor formed by the bit line BLn and the memory cell string 310. In some embodiments, first switch T1 can be implemented using a p-type metal-oxide-semiconductor (PMOS) transistor. In some embodiments, second switch T2, third switch T3, and fourth switch T4 can be implemented using n-type metal-oxide-semiconductor (NMOS) transistors.

During a pre-charge phase of operation, a pre-charge current can be injected into the second end of first switch T1 by turning on the first switch T1. This can be achieved by setting a signal PRE to a certain voltage level, thus raising the voltage level of the second end of first switch T1 voltage level to the system voltage VDD. A signal Vblclamp is applied to turn on the second switch T2 and another signal Vblbias is applied to turn on the fourth switch T4. The third switch T3 is turned off as indicated by a signal Vsoblk being deactivated.

Following the pre-charge phase, the word lines coupled to unselected memory cells can be given a pass voltage. The pass voltage can cause the unselected memory cells coupled to those word lines to operate in a pass mode regardless of their state. In some embodiments, a sensing operation can be performed on memory cells to determine the data state of memory cells and to determine whether to activate the memory cells. For example, word line WLm coupled to a selected memory cell C(m,n) can be biased with a sensing voltage to determine the data state of the memory cell C(m,n). If the threshold voltage of the memory cell C(m,n) is above a sensing voltage, the memory cell C(m,n) would not be activated and the bit line BLn would remain at a pre-charge voltage. If the threshold voltage of the memory cell C(m,n) is below the sensing voltage, the memory cell C(m,n) would be activated and the bit line BLn will be discharged through memory cell string 310.

During a programming phase, suitable programming pulses are applied to word lines of select memory cells. In some embodiments, the programming operations can be performed in loops with the bit line biased with different voltages. For example, the programming operations can include applying at least one programming pulse to a memory cell such as memory cell C(m,n) during a first programming loop and applying at least one programming pulse to the memory cell during a second programming loop succeeding the first programming loop. In some embodiments, a bit line bias voltage is applied to the memory cell according to a result of comparing a threshold voltage of the non-volatile memory cell in the first programming loop with a low verify level and/or a high verify level of a target data state of the non-volatile memory cell. In some embodiments, the bit line bias voltage can be applied based on a result of comparing a threshold voltage of the non-volatile memory cell in the second programming loop with the low verify level and/or the high verify level of the target data state of the non-volatile memory cell.

Figure 4:
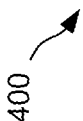
FIG. 4 illustrates a schematic diagram of a memory system having a memory device, according to some embodiments.

FIG. 4 illustrates a schematic diagram of a memory system having a memory device, according to some embodiments. Memory system 400 of FIG. 4 includes memory device 104 and controller 420. Memory device 104 includes peripheral circuit 410 and NAND flash memory chips 430. In some aspects, peripheral circuit 410 may be or include the peripheral circuit 132 in FIG. 1D. NAND flash memory chips 430 may be or include memory cell array 131 in FIG. 1D. Peripheral circuit 410 can include an enable voltage generator 412, a programming voltage generator 414, and a voltage regulator 416. Peripheral circuit 410 can further include additional circuits that are not illustrated in FIG. 4 for simplicity.

Peripheral circuit 410 can be coupled to NAND flash memory chips 430 in a memory device, such as memory device 104. Controller 420 can include a memory controller 106 in FIG. 1A. Controller 420 can be coupled to memory device 104 including peripheral circuit 410 and NAND flash memory chips 430 to control operations thereof. NAND flash memory chips 430 can include arrays of flash memory chips, with each chip including arrays NAND flash memory cells similar to those described in FIGS. 1A-E and 3. Each memory cell may be programmed into one of multiple possible program states, such as 8 or more program states. Specifically, each memory cell may be programmed into a low program state using a start programming voltage and into higher program states using higher-state programming voltages.

Peripheral circuit 410 can be configured to apply an initial programming voltage pulse to NAND flash memory chips 430. For example, peripheral circuit 410 can include programming voltage generator 412 configured to apply various programming voltage pulses to gate terminals of selected memory cells of NAND flash memory chips 430 via one or more word lines. An initial programming voltage pulse can be a predetermined setting selected to accommodate memory cell variations, page-to-page variations, and block-to-block variations. Peripheral circuit 410 can be further configured to output other voltage bias, such as enabling signals generated by enabling signal generator 414 and suitable voltage levels by voltage regulator 416.

Controller 420 can be coupled to memory device 104 and configured to control peripheral circuit 410 and NAND flash memory chips 430, according to some implementations. Controller 420 can be configured to determine one or more magnitudes of programming pulses or bias voltages for memory programming for memory device 104. For example, controller 420 can be configured to control peripheral circuit 410 for outputting programming pulses and bias voltages to terminals of NAND flash memory chips 430, such as word lines, bit lines, driver circuits, and any suitable terminals or circuit components of NAND flash memory chips 430. In some embodiments, controller 420 can be configured to produce and enable programming pulses and bias voltages according to the wave diagrams illustrated in FIGS. 6 and 7.

Figure 6:
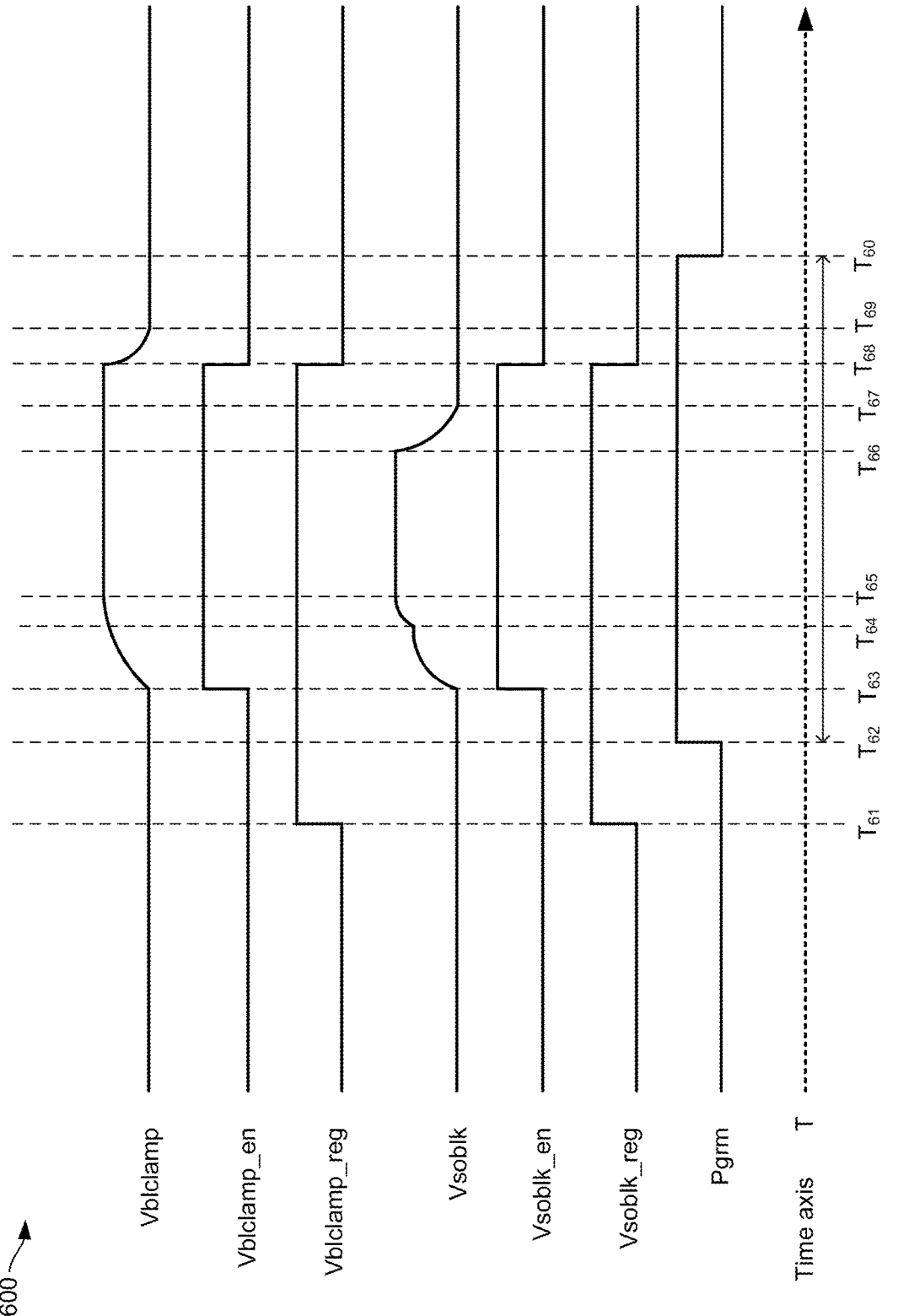
FIG. 6 illustrates a schematic diagram illustrating voltage changing of various lines or nodes in the circuit during various phases of programming operation, according to some embodiments of the present disclosure.

FIG. 5 is a flow diagram of an exemplary method 500 for performing a programming operation of a flash memory string, in accordance with some embodiments of the present disclosure. The operations of method 500 can be performed in a different order and/or vary, and method 500 can include more operations that are not described for simplicity. Various applications of method 500 in memory block management are within the scope of this disclosure. FIG. 6 illustrates a schematic diagram illustrating voltage changing of various lines or nodes in the circuit during various phases of programming operation in connection with FIG. 5, and will be described together according to some embodiments.

Referring to FIG. 5, method 500 starts at operation 510, in which a bit line clamp regulation voltage and a control signal regulation voltage can be ramped up at a same time point. As shown in FIG. 6, the bit line clamp regulation voltage Vblclamp_reg can be ramped up from a low level (e.g., Vss) to a high level at the time point T61, and the control signal regulation voltage Vblclamp_reg can be ramped up from a low level (e.g., Vss) to a high level at the time point T61.

Referring to FIG. 5, method 500 proceeds to operation 520, in which a programming voltage can be ramped up. As shown in FIG. 6, the programming voltage Pgrm can be ramped up from a low level (e.g., Vss) to a high level at the time point T62.

Method 500 then proceeds to operation 530, in which a bit line clamp enabling voltage and a control signal enabling voltage can be ramped up at a same time point. As shown in FIG. 6, the bit line clamp enabling voltage Vblclamp_en can be ramped up from a low level (e.g., Vss) to a high level at the time point T63, and the control signal enabling voltage Vblclamp_en can be ramped up from a low level (e.g., Vss) to a high level at the time point T63.

Next, method 500 proceeds to operation 540, in which a bit line clamp voltage can be increased in one stage, and a control signal voltage can be increased in two stages. In some embodiments, the control signal voltage can be increased from a low level to an intermediate level, and then be increased from the intermediate level to high level. During the same time of the two stages for increasing the control signal voltage, the bit line clamp voltage can be increased from a low level to a high level in one stage.

As shown in FIG. 6, the bit line clamp voltage Vblclamp can start to increase from a low level (e.g., Vss) at the time point T63, and the control signal voltage Vblclamp can start to increase from a low level (e.g., Vss) to a at the time point T63. The control signal voltage Vsoblk can reach the intermediate level at the time point T64, and can then start to increase from the intermediate level at the time point T64 to reach the high level at a time point T65. The bit line clamp voltage Vblclamp increases from a low level (e.g., Vss) at the time point T63 to reach the high level at the time point T65.

Referring again to FIG. 5, method 500 proceeds to operation 550, in which the control signal voltage can be decreased from the high level to the low level. As shown in FIG. 6, the control signal voltage Vsoblk can start to decrease from the high level at the time point T66, and can reach the low level at a time point T67.

Method 500 then proceeds to operation 560, in which the bit line clamp enabling voltage, the bit line clamp regulation voltage, the control signal enabling voltage, and the control signal regulation voltage can be ramped down, and the bit line clamp voltage can start to decrease from the high level to the low level. As shown in FIG. 6, the bit line clamp enabling voltage Vblclamp_en can be ramped down from the high level to the low level at the time point T68. The bit line clamp regulation voltage Vblclamp_reg can be ramped down from the high level to the low level at the time point T68. The control signal enabling voltage Vblclamp_en can be ramped down from the high level to the low level at the time point T68. The control signal regulation voltage Vblclamp_reg can be ramped down from the high level to the low level at the time point T68. Further, the bit line clamp voltage Vblclamp can start to decrease from the high level (e.g., Vss) at the time point T68, and can reach the low level at a time point T69.

Lastly, method 500 proceeds to operation 570, in which the programming voltage can be ramped down. As shown in FIG. 6, the programming voltage Pgrm can be ramped down from the high level to the low level at the time point T60.

Figure 7:
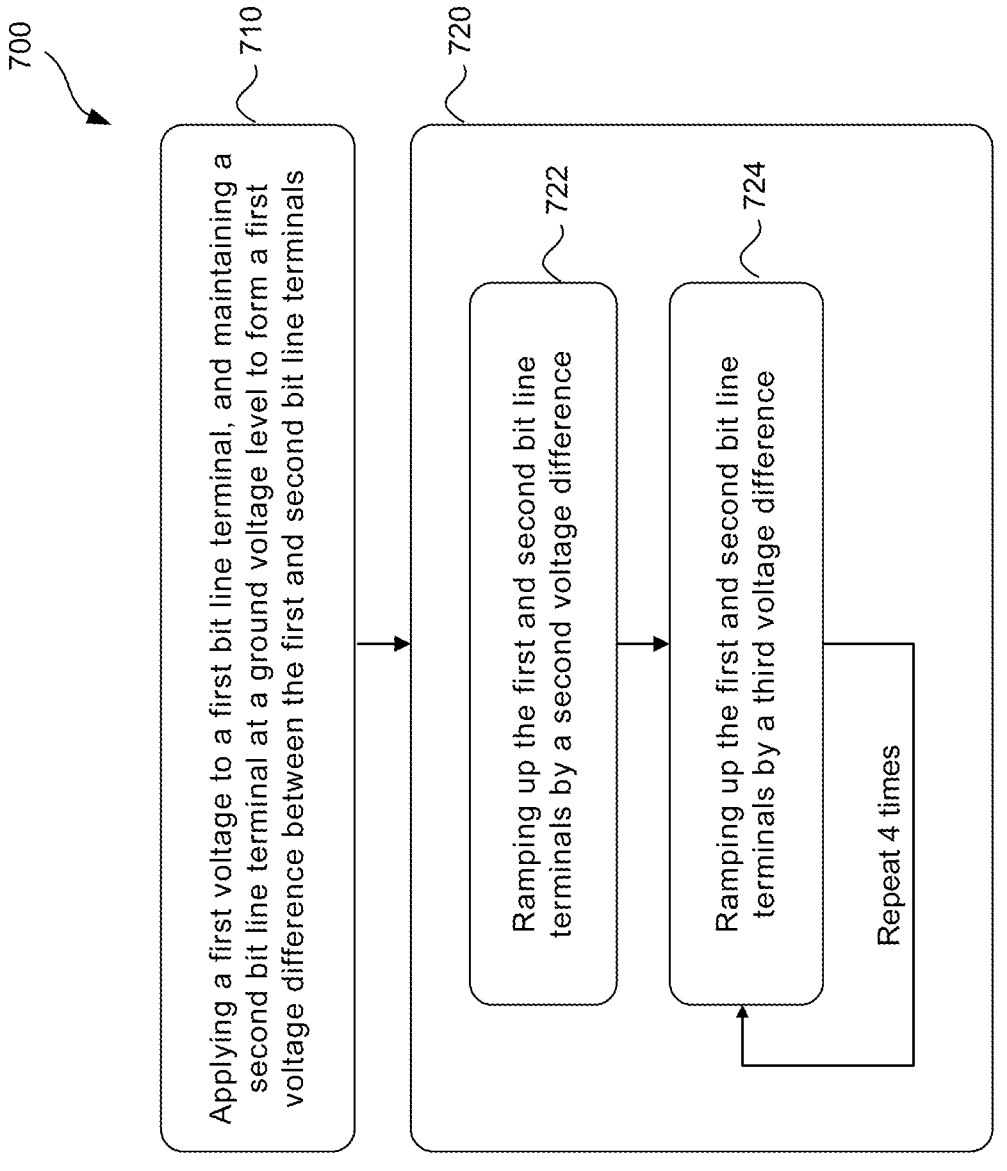
FIG. 7 illustrates a flow diagram of an exemplary method for controlling bit line voltage biases during a programming operation of a three-dimensional NAND memory device, in accordance with some embodiments of the present disclosure.
Figure 8:
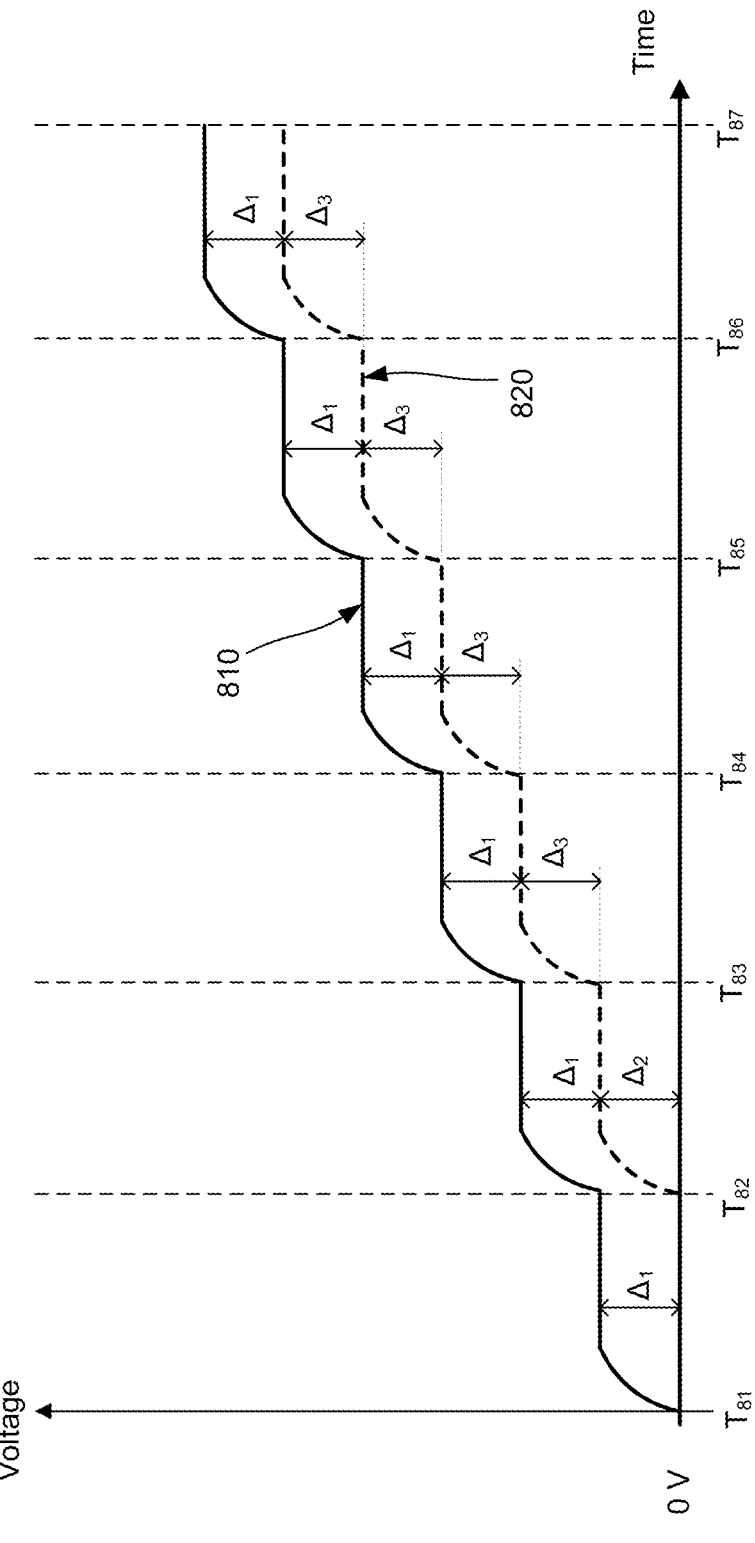
FIG. 8 illustrates a schematic diagram illustrating voltage changing of various lines or nodes in the circuit during various phases of programming operation, according to some embodiments of the present disclosure.

FIG. 7 illustrates a flow diagram of an exemplary method 700 for controlling bit line voltage biases during a programming operation of a three-dimensional NAND memory device, in accordance with some embodiments of the present disclosure. The operations of method 700 can be performed in a different order and/or vary, and method 700 can include more operations that are not described for simplicity. Various applications of method 700 in memory block management are within the scope of this disclosure. FIG. 8 illustrates a schematic diagram illustrating voltage changing of various lines or nodes in the circuit during various phases of programming operation in connection with FIG. 7, and will be described together according to some embodiments.

In some embodiments, method 700 can include a multi-stage voltage ramping sequence applied to bit line terminals to provide improved bit line voltage uniformity. For example, the multi-stage voltage ramping sequence can be a two-stage ramping sequence that includes a first-stage ramp-up procedure 710 and a second-stage ramp-up procedure 720.

In some embodiments, the first-stage ramp-up procedure 710 can include applying a first voltage to a first bit line terminal while maintaining a second bit line terminal at a ground voltage level, therefore establishing a first voltage difference between the first and second bit line terminals. As shown in FIG. 8, the solid curve 810 represents the voltage level of the first bit line terminal over time, and the dashed curve 820 represents the voltage level of the second bit line terminal over time.

The voltage level of the first bit line terminal can start to be ramped up from the ground voltage level to a first voltage level. At the same time, the second bit line terminal can be kept at the ground voltage level. When the first bit line terminal stably keeps at the first voltage level, the first voltage difference $\Delta 1$ between the first and second bit line terminals is equal to the first voltage level. In some embodiments, the first voltage difference $\Delta 1$ can be the same as the desired voltage different between a target voltage of the first bit line terminal and a target voltage of the second bit line terminals, and can be in a range from about 0.25 V to about 0.95 V. In some embodiments to realize the first-stage ramp-up procedure 710, the control signal Vsoblk can have a voltage value substantially equal to $(\Delta 1 - 0.25)/0.0125$, and the bit line clamp voltage Vblclamp can be set to 0.

Referring to FIG. 7, the second-stage ramp-up procedure 720 can include multiple sub-stages ramp-up procedures that increase voltage levels of the first and second bit line terminals to their respective nominal voltage levels.

In some embodiments, the second-stage ramp-up procedure 720 can include a first sub-stage ramp-up procedure 722, in which both the first and second bit line terminals can be ramped up with a second voltage difference. As shown in FIG. 8, the voltage level of the first bit line terminal can start to be ramped up from the first voltage level (i.e., $\Delta 1$) to a level equal to the first voltage level plus the second voltage difference $(\Delta 1 + \Delta 2)$. At the same time, the second bit line terminal can be ramped up, for example simultaneously, and from the ground level $\Delta 1$ to a level equal to the second voltage difference $\Delta 2$. When the first and second bit line terminals stably reach the target levels of the first sub-stage ramp-up procedure 722, the voltage difference between the first and second bit line terminals can be substantially kept as the first voltage difference $\Delta 1$. In some embodiments, the second voltage difference $\Delta 2$ can be substantially equal to 0.25 V. In some embodiments to realize the first sub-stage ramp-up procedure 722, the control signal Vsoblk can be increased by about 20 V from its previous value, and the bit line clamp voltage Vblclamp can be set to 0.

Referring to FIG. 7, in some embodiments, the second-stage ramp-up procedure 720 can further include a plurality of second sub-stage ramp-up procedures 724. In each of the plurality of second sub-stage ramp-up procedures 724, both the first and second bit line terminals can be ramped up with a third voltage difference.

As shown in FIG. 8, the second-stage ramp-up procedure 720 can include four second sub-stage ramp-up procedures 724. During each second sub-stage ramp-up procedure 724, the voltage level of the first bit line terminal can start to be ramped up to increase the third voltage difference $\Delta 3$. At the same time, the second bit line terminal can be ramped up, for example simultaneously, and to increase the third voltage difference $\Delta 3$. When the first and second bit line terminals stably reach the target levels of each second sub-stage ramp-up procedure 724, the voltage difference between the first and second bit line terminals can be substantially kept as the first voltage difference $\Delta 1$. In some embodiments, the third voltage difference $\Delta 3$ can be substantially equal to $(V2-0.25)/4$, wherein $V2$ is a target voltage of the second bit line terminal. In some embodiments to realize the first sub-stage ramp-up procedure 722, the control signal Vsoblk can be increased by about $((V2-0.25)/4)/0.0125$ from its previous value, and the bit line clamp voltage Vblclamp can be increased by about $((V2-0.25)/4)/0.0125$ from its previous value.

Therefore, during the second-stage ramp-up procedure 720, a substantially constant voltage differential between the first and second bit line terminals $\Delta 1$ can be maintained throughout the ramp-up process to reduce undesirable coupling. During the programming sequence, the established voltage levels of the first and second bit line terminals can be left floating, according to some embodiments. Benefits of using the multi-stage voltage ramping sequence and floating the bit line terminals can provide benefits such as, but not limited to, improved bit line voltage set up and state differentiation, reduced side effects of bit line terminal coupling, unified firmware control, and no additional hardware costs.

Figure 9:
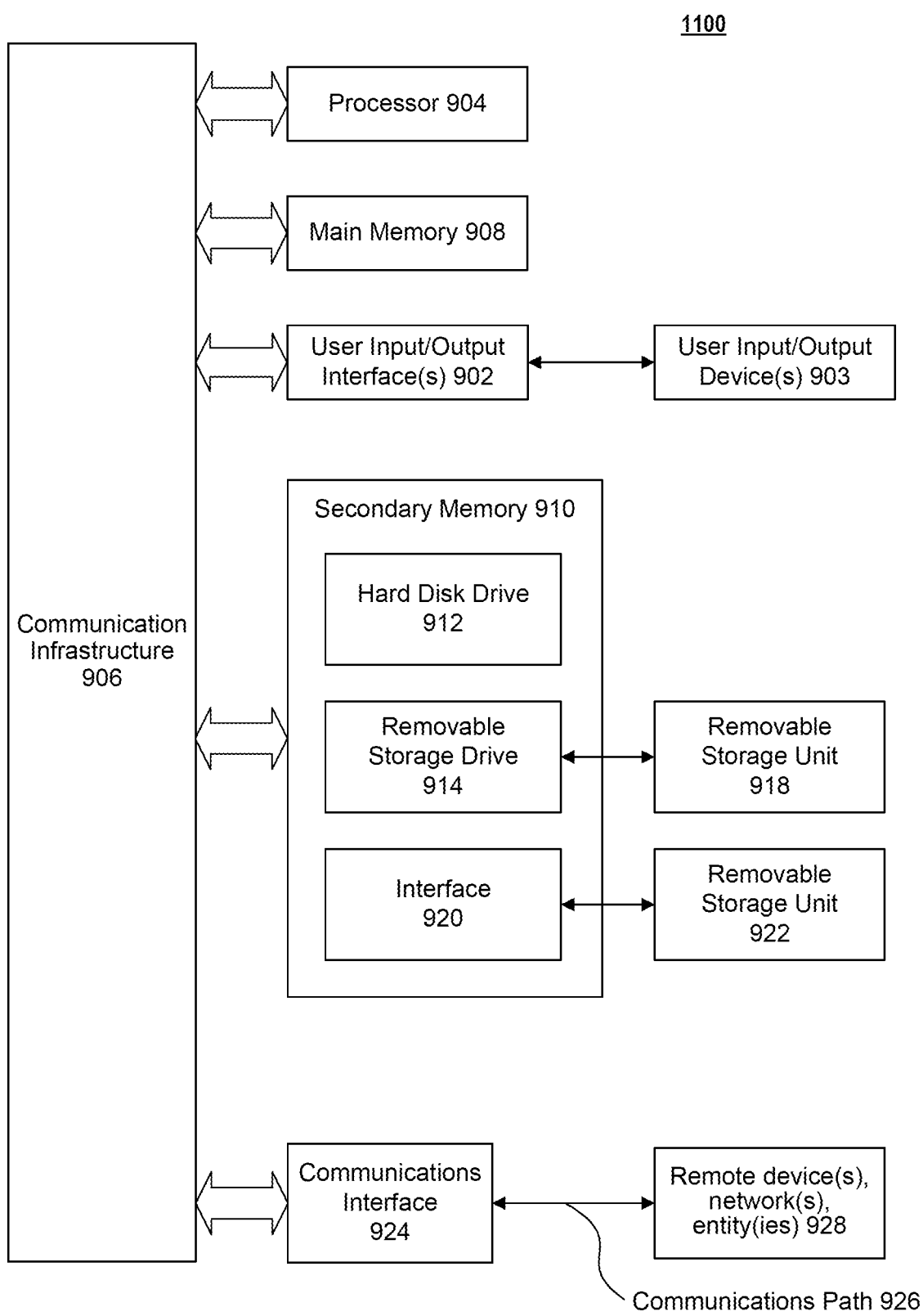
FIG. 9 illustrates a schematic diagram of an exemplary computer system, according to some embodiments of the present disclosure.

Various disclosed aspects can be implemented, for example, using one or more computer systems, such as computer system 900 shown in FIG. 9. Computer system 900 can be any computer capable of performing the functions described herein such as the flash memory system 400 of FIG. 4. Computer system 900 includes one or more processors (also called central processing units, or CPUs), such as a processor 904. Processor 904 is connected to a communication infrastructure 906 (e.g., a bus.) Computer system 900 also includes user input/output device(s) 903, such as monitors, keyboards, pointing devices, etc., that communicate with communication infrastructure 906 through user input/output interface(s) 902. Computer system 900 also includes a main or primary memory 908, such as random access memory (RAM). Main memory 908 can include one or more levels of cache. Main memory 908 has stored therein control logic (e.g., computer software) and/or data.

Computer system 900 can also include one or more secondary storage devices or memory 190. Secondary memory 910 can include, for example, a hard disk drive 912 and/or a removable storage device or drive 914. Removable storage drive 914 can be a floppy disk drive, a magnetic tape drive, a compact disk drive, an optical storage device, tape backup device, and/or any other storage device/drive.

Removable storage drive 914 can interact with a removable storage unit 918. Removable storage unit 918 includes a computer usable or readable storage device having stored thereon computer software (control logic) and/or data. Removable storage unit 918 can be a floppy disk, magnetic tape, compact disk, DVD, optical storage disk, and/any other computer data storage device. Removable storage drive 914 reads from and/or writes to removable storage unit 918 in a well-known manner.

According to some aspects, secondary memory 910 can include other means, instrumentalities or other approaches for allowing computer programs and/or other instructions and/or data to be accessed by computer system 900. Such means, instrumentalities or other approaches can include, for example, a removable storage unit 922 and an interface 920. Examples of the removable storage unit 922 and the interface 920 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 900 can further include a communication or network interface 924. Communication interface 924 enables computer system 900 to communicate and interact with any combination of remote devices, remote networks, remote entities, etc. (individually and collectively referenced by reference number 928). For example, communication interface 924 can allow computer system 900 to communicate with remote devices 928 over communications path 926, which can be wired and/or wireless, and which can include any combination of LANs, WANs, the Internet, etc. Control logic and/or data can be transmitted to and from computer system 900 via communication path 926.

The operations in the preceding aspects can be implemented in a wide variety of configurations and architectures. Therefore, some or all of the operations in the preceding aspects can be performed in hardware, in software or both. In some aspects, a tangible, non-transitory apparatus or article of manufacture includes a tangible, non-transitory computer useable or readable medium having control logic (software) stored thereon is also referred to herein as a computer program product or program storage device. This includes, but is not limited to, computer system 900, main memory 908, secondary memory 910 and removable storage units 918 and 922, as well as tangible articles of manufacture embodying any combination of the foregoing. Such control logic, when executed by one or more data processing devices (such as computer system 900), causes such data processing devices to operate as described herein.

Based on the teachings contained in this disclosure, it will be apparent to persons skilled in the relevant art(s) how to make and use aspects of the disclosure using data processing devices, computer systems and/or computer architectures other than that shown in FIG. 9. In particular, aspects can operate with software, hardware, and/or operating system implementations other than those described herein.

Accordingly, systems, methods, and media for controlling bit line voltages in a three-dimensional (3D) memory device are disclosed.

Some aspects of this disclosure relate to a three-dimensional memory device. The three-dimensional memory device can include a plurality of bit lines; a peripheral circuit coupled to the plurality of bit lines and configured to provide voltages to the plurality of bit lines; and a controller configured to control the peripheral circuit. The peripheral circuit can be configured to ramp up a bit line clamp regulation voltage and a control signal regulation voltage, ramp up a bit line clamp enabling voltage and a control signal enabling voltage, increase a bit line clamp voltage in one stage, and increase a control signal voltage in two stages, decrease the control signal voltage, ramp down the bit line clamp enabling voltage, the bit line clamp regulation voltage, the control signal enabling voltage, and the control signal regulation voltage, and decrease the bit line clamp voltage.

According to some aspects, the controller can be further configured to control the peripheral circuit to: ramp up the bit line clamp regulation voltage and the control signal regulation voltage at a same first time point; and ramp up the bit line clamp enabling voltage and the control signal enabling voltage at a same second time point after the first time point.

According to some aspects, the controller can be further configured to control the peripheral circuit to: start to increase the bit line clamp voltage and the control signal voltage from a low level at the second time point, and start to increase the control signal voltage from an intermediate level at a third time point, such that the bit line clamp voltage and the control signal voltage reach their high levels respectively at a same fourth time point.

According to some aspects, the controller can be further configured to control the peripheral circuit to: decrease the control signal voltage to the low level before ramping down the bit line clamp enabling voltage, the bit line clamp regulation voltage, the control signal enabling voltage, and the control signal regulation voltage.

According to some aspects, the controller can be further configured to control the peripheral circuit to: ramp down the bit line clamp enabling voltage, the bit line clamp regulation voltage, the control signal enabling voltage, and the control signal regulation voltage, and start to decrease the bit line clamp voltage at a same fifth time.

Some aspects of this disclosure relate to a memory device. The memory device includes a plurality of bit lines; a peripheral circuit configured to provide voltages to the plurality of bit lines; and a controller configured to control the peripheral circuit to: generate a first voltage difference between a first bit line terminal and a second bit line terminal, ramp up the first bit line terminal and the second bit line terminal by a second voltage difference, and ramp up the first bit line terminal and the second bit line terminal by a third voltage difference. The first, second and third voltage differences can be different from each other.

According to some aspects, the controller can be further configured to control the peripheral circuit to: increase a first voltage to the first bit line terminal, and maintain the second bit line terminal at a ground voltage level to form the first voltage difference between the first and second bit line terminals.

According to some aspects, the controller can be further configured to control the peripheral circuit to: increase the first bit line terminal and the second bit line terminal by a pre-determined fixed voltage as the second voltage difference, such that the first and second bit line terminals substantially keep the first voltage difference.

According to some aspects, the controller can be further configured to control the peripheral circuit to: repeating at least four times of increasing the first bit line terminal and the second bit line terminal by the third voltage difference, such that the first and second bit line terminals substantially keep the first voltage difference.

According to some aspects, the first voltage difference can be in a range between about 0.25V and about 0.95V. The second voltage difference can be about 0.25V. The third voltage different can be a quarter of a difference between a target voltage of the second bit line terminal and 0.25V.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for controlling bit line voltages in a three-dimensional memory device, comprising:

ramping up a bit line clamp regulation voltage and a control signal regulation voltage;

ramping up a bit line clamp enabling voltage and a control signal enabling voltage;

increasing a bit line clamp voltage in one stage, and increasing a control signal voltage in two stages;

decreasing the control signal voltage;

ramping down the bit line clamp enabling voltage, the bit line clamp regulation voltage, the control signal enabling voltage, and the control signal regulation voltage; and decreasing the bit line clamp voltage, wherein the bit line clamp regulation voltage, the bit line clamp enabling voltage, and the bit line clamp voltage, the control signal regulation voltage, and the control signal enabling voltage are each different bit line signals.

2. The method of claim 1, wherein:

the bit line clamp regulation voltage and the control signal regulation voltage are ramped up at a same first time point; and the bit line clamp enabling voltage and the control signal enabling voltage are ramped up at a same second time point after the first time point.

3. The method of claim 2, wherein the ramping up the bit line clamp regulation voltage and the control signal regulation voltage comprises:

increasing the bit line clamp voltage and the control signal voltage from a low level at the second time point, and starting to increase the control signal voltage from an intermediate level at a third time point, such that the bit line clamp voltage and the control signal voltage reach their high levels respectively at a fourth time point.

4. The method of claim 3, wherein decreasing the control signal voltage comprises:

decreasing the control signal voltage to the low level before ramping down the bit line clamp enabling voltage, the bit line clamp regulation voltage, the control signal enabling voltage, and the control signal regulation voltage.

5. The method of claim 4, wherein ramping down the bit line clamp enabling voltage, the bit line clamp regulation voltage, the control signal enabling voltage, and the control signal regulation voltage, and decreasing the bit line clamp voltage comprises:

ramping down the bit line clamp enabling voltage, the bit line clamp regulation voltage, the control signal enabling voltage, and the control signal regulation voltage, and starting to decrease the bit line clamp voltage at a same fifth time.

6. A method for controlling bit line voltages in a three-dimensional memory device, comprising:

generating a first voltage difference between a first bit line terminal and a second bit line terminal;

ramping up the first bit line terminal and the second bit line terminal by a second voltage difference, wherein the second voltage difference is different from the first voltage difference;

ramping up the first bit line terminal and the second bit line terminal by a third voltage difference, wherein the third voltage difference is different from the first and second voltage differences; and repeating the ramping up the first bit line terminal and the second bit line terminal by the third voltage difference a plurality of times, wherein the first voltage difference is formed based on a first pair of bit line signals and the second voltage difference is formed by a second pair of bit line signals different from the first pair.

7. The method of claim 6, wherein the generating the first voltage difference between the first bit line terminal and the second bit line terminal comprises:

increasing a first voltage to the first bit line terminal, and maintaining the second bit line terminal at a ground voltage level to form the first voltage difference between the first and second bit line terminals.

8. The method of claim 6, wherein the ramping up the first bit line terminal and the second bit line terminal by the second voltage difference comprises:

increasing the first and second bit line terminals with a pre-determined fixed value as the second voltage difference, such that the first and second bit line terminals substantially keep the first voltage difference.

9. The method of claim 6, wherein the ramping up the first bit line terminal and the second bit line terminal by the third voltage difference comprises:

increasing the first and second bit line terminals with the third voltage difference, such that the first and second bit line terminals substantially keep the first voltage difference.

10. The method of claim 6, wherein the repeating the ramping up the first bit line terminal and the second bit line terminal by the third voltage difference the plurality of times comprises:

repeating the ramping up the first bit line terminal and the second bit line terminal by the third voltage difference at least three times.

11. A three-dimensional memory device, comprising:

a plurality of bit lines;

a peripheral circuit coupled to the plurality of bit lines and configured to provide voltages to the plurality of bit lines; and a controller configured to control the peripheral circuit to:

ramp up a bit line clamp regulation voltage and a control signal regulation voltage, ramp up a bit line clamp enabling voltage and a control signal enabling voltage, increase a bit line clamp voltage in one stage, and increase a control signal voltage in two stages, decrease the control signal voltage, ramp down the bit line clamp enabling voltage, the bit line clamp regulation voltage, the control signal enabling voltage, and the control signal regulation voltage, and decrease the bit line clamp voltage, wherein the bit line clamp regulation voltage, the bit line clamp enabling voltage, and the bit line clamp voltage, the control signal regulation voltage, and the control signal enabling voltage are each different bit line signals.

12. The memory device of claim 11, wherein the peripheral circuit is further configured to:

ramp up the bit line clamp regulation voltage and the control signal regulation voltage at a same first time point; and ramp up the bit line clamp enabling voltage and the control signal enabling voltage at a same second time point after the first time point.

13. The memory device of claim 12, wherein the peripheral circuit is further configured to:

start to increase the bit line clamp voltage and the control signal voltage from a low level at the second time point, and start to increase the control signal voltage from an intermediate level at a third time point, such that the bit line clamp voltage and the control signal voltage reach their high levels respectively at a same fourth time point.

14. The memory device of claim 13, wherein the peripheral circuit is further configured to:

decrease the control signal voltage to the low level before ramping down the bit line clamp enabling voltage, the bit line clamp regulation voltage, the control signal enabling voltage, and the control signal regulation voltage.

15. The memory device of claim 14, wherein the peripheral circuit is further configured to:

ramp down the bit line clamp enabling voltage, the bit line clamp regulation voltage, the control signal enabling voltage, and the control signal regulation voltage, and start to decrease the bit line clamp voltage at a same fifth time.

16. The memory device of claim 11, wherein the peripheral circuit is further configured to:

generate a first voltage difference between a first bit line terminal and a second bit line terminal, ramp up the first bit line terminal and the second bit line terminal by a second voltage difference, and ramp up the first bit line terminal and the second bit line terminal by a third voltage difference, wherein the first, second and third voltage differences are different from each other.

17. The memory device of claim 16, wherein the peripheral circuit is further configured to:

increase a first voltage to the first bit line terminal, and maintain the second bit line terminal at a ground voltage level to form the first voltage difference between the first and second bit line terminals.

18. The memory device of claim 16, wherein the peripheral circuit is further configured to:

increase the first bit line terminal and the second bit line terminal by a pre-determined fixed voltage as the second voltage difference, such that the first and second bit line terminals substantially keep the first voltage difference.

19. The memory device of claim 16, wherein the peripheral circuit is further configured to:

repeating at least four times of increasing the first bit line terminal and the second bit line terminal by the third voltage difference, such that the first and second bit line terminals substantially keep the first voltage difference.

20. The memory device of claim 16, wherein:

the first voltage difference is in a range between about 0.25V and about 0.95V;

the second voltage difference is about 0.25V;

the third voltage different is a quarter of a difference between a target voltage of the second bit line terminal and 0.25V.

\* \* \* \* \*